US012769913B2

(12) United States Patent
Gras et al.

(10) Patent No.: US 12,769,913 B2
(45) Date of Patent: Oct. 20, 2026

(54) DETECTING POTENTIAL SECURITY ISSUES IN A HARDWARE DESIGN USING REGISTER TRANSFER LEVEL (RTL) INFORMATION FLOW TRACKING

(71) Applicant: Intel Corporation, Santa Clara, CA (US)

(72) Inventors: Benjamin Gras, Naarden (NL); Daniël Trujillo, Zurich (CH)

(73) Assignee: INTEL CORPORATION, Santa Clara, CA (US)

(*) Notice: Subject to any disclaimer, the term of this patent is extended or adjusted under 35 U.S.C. 154(b) by 873 days.

(21) Appl. No.: 18/193,811

(22) Filed: Mar. 31, 2023

(65) Prior Publication Data

US 2024/0330550 A1 Oct. 3, 2024

(51) Int. Cl.
*G06F 30/3308* (2020.01)
*G06F 30/327* (2020.01)

(52) U.S. Cl.
CPC ........ *G06F 30/3308* (2020.01); *G06F 30/327* (2020.01)

(58) Field of Classification Search
CPC ............... G06F 30/3308; G06F 30/327; G06F 11/2215; G06F 11/2268; G06F 11/2273; G06F 11/261; G06F 11/273
See application file for complete search history.

(56) References Cited

U.S. PATENT DOCUMENTS

2005/0268265 A1* 12/2005 Ly ........................... G06F 30/33 716/108
2018/0336031 A1* 11/2018 DeHon ............... G06F 12/0875
2021/0133324 A1* 5/2021 Chari .................... G06F 21/566
(Continued)

FOREIGN PATENT DOCUMENTS

CN 118733358 A 10/2024

OTHER PUBLICATIONS

Kim, Young Soo. A Dataflow based Hardware Design Methodology for Digital Signal Processing Algorithms. North Carolina State University, 2014. (Year: 2014).*
(Continued)

*Primary Examiner* — Chuen-Meei Gan
(74) *Attorney, Agent, or Firm* — Jaffery Watson Hamilton & DeSanctis LLP

(57) ABSTRACT

Embodiments described herein are generally directed to detecting security issues in a hardware design using IFT. In an example, dataflows are tracked within a hardware design represented in an HDL without instrumenting the HDL. Dataflow primitives are received specifying taint sources from which the dataflows are to be tracked. A baseline simulation trace log is obtained for a baseline RTL simulation of the hardware design by causing a simulator to perform the baseline RTL simulation during which none of the taint sources are altered. Injection simulation trace logs are obtained for injection RTL simulations by causing the simulator to perform an injection RTL simulation, for each taint source, during which the taint source is altered. The dataflows are then identified based on comparisons between the baseline and the injection simulation trace logs. A potential security issue is detected within the hardware design by applying a policy to the dataflows.

20 Claims, 10 Drawing Sheets

(56) References Cited

U.S. PATENT DOCUMENTS

2024/0330550 A1 10/2024 Gras et al.

OTHER PUBLICATIONS

Sutherland, S. "I'm Still in Love With My X!" Design and Verification Conference and Exhibition Feb. 2013, 23 pages.
Ardeshiricham et al., "Register Transfer Level Information Flow Tracking for Provably Secure Hardware Design", Department of Computer Science and Engineering, University of California San Diego, 6 pages.
Radix Automated Security Verification, Cycuity, 2022, 4 pages.
Solt, F. et al., "CellIFT: Leveraging Cells for Scalable and Precise Dynamic Information Flow Tracking in RTL", Feb. 6, 2023 downloaded from https://www.usenix.org/conference/usenixsecurity22/presentation/solt, 3 pages.
Tiwari, M. et al., "Complete Information Flow Tracking from the Gates Up", Department of Computer Science and Engineering, University of California Santa Barbara, ASPLOS 2009, Washington DC, 12 pages.

* cited by examiner

500

| | starttime 510 | track 520 | flowid 530 | Logic 540 |
|---|---|---|---|---|
| 561 | posedge(dut.Core.IO.ResponseValidEn) | Core.IO.ResponseData[] | | |
| 562 | high(dut.Core.IO.ResponseValidH) | Core.IO.ResponseData[63:0] | | |
| 563 | low(dut.Core.IO.ResponseValidH) | Core.IO.ResponseData[] | 0 | |
| 564 | high(dut.Core.IO.ResponseValidH) | Core.IO.ResponseData[63:0] | "sim.flownumber % 10" | |
| 565 | high(dut.Core.ResetN) and<br>sim.time < 1000 and posedge(dut.Core.IO.ResponseValidEn) and<br>logic.packets23 > 10 | Core.IO.ResponseData[] | | "<br>if<br>posedge(dut.Core.IO.HeaderEn)<br>and dut.Core.IO.Header.Cmd<br>== 0x23:<br>logic.packets23 += 1<br>" |

FIG. 5

DETECTING POTENTIAL SECURITY ISSUES IN A HARDWARE DESIGN USING REGISTER TRANSFER LEVEL (RTL) INFORMATION FLOW TRACKING

TECHNICAL FIELD

Embodiments described herein generally relate to the field of Register Transfer Level (RTL) simulation and Information Flow Tracking (IFT) and, more particularly, to identification of potential hardware design security issues at design time (e.g., pre-silicon) in a simulation environment.

BACKGROUND

IFT, which may also be referred to herein as taint tracking, is a technique to follow the trail of data as it flows through the execution of software or, in the context of this patent application, RTL simulations of a hardware design. IFT is a technique for verification and assurance at design time, not a feature to be used in a design as it appears in a product. IFT has many applications for security, including, but not limited to, evaluating:

- Whether stale data remains in registers/buffers to be exploited (e.g., Meltdown, Microarchitectural Data Sampling (MDS), and architecturally leaking uninitialized data from the microarchitecture (AEPIC leak))
- Whether secret data remains compartmented
- Whether a reset truly reinitializes the state of a design with no trace of the previous state of the design The above-listed security issues can manifest as security vulnerabilities or security problems, rather than functional problems. As such, these problems are not caught by traditional, finely honed functional verification, but can be caught with IFT.

BRIEF DESCRIPTION OF THE DRAWINGS

Embodiments described here are illustrated by way of example, and not by way of limitation, in the figures of the accompanying drawings in which like reference numerals refer to similar elements.

FIG. 5 is a table illustrating examples of logical conditions and expressions that may be used to specify a dataflow according to some embodiments.

DETAILED DESCRIPTION

Figure 1:
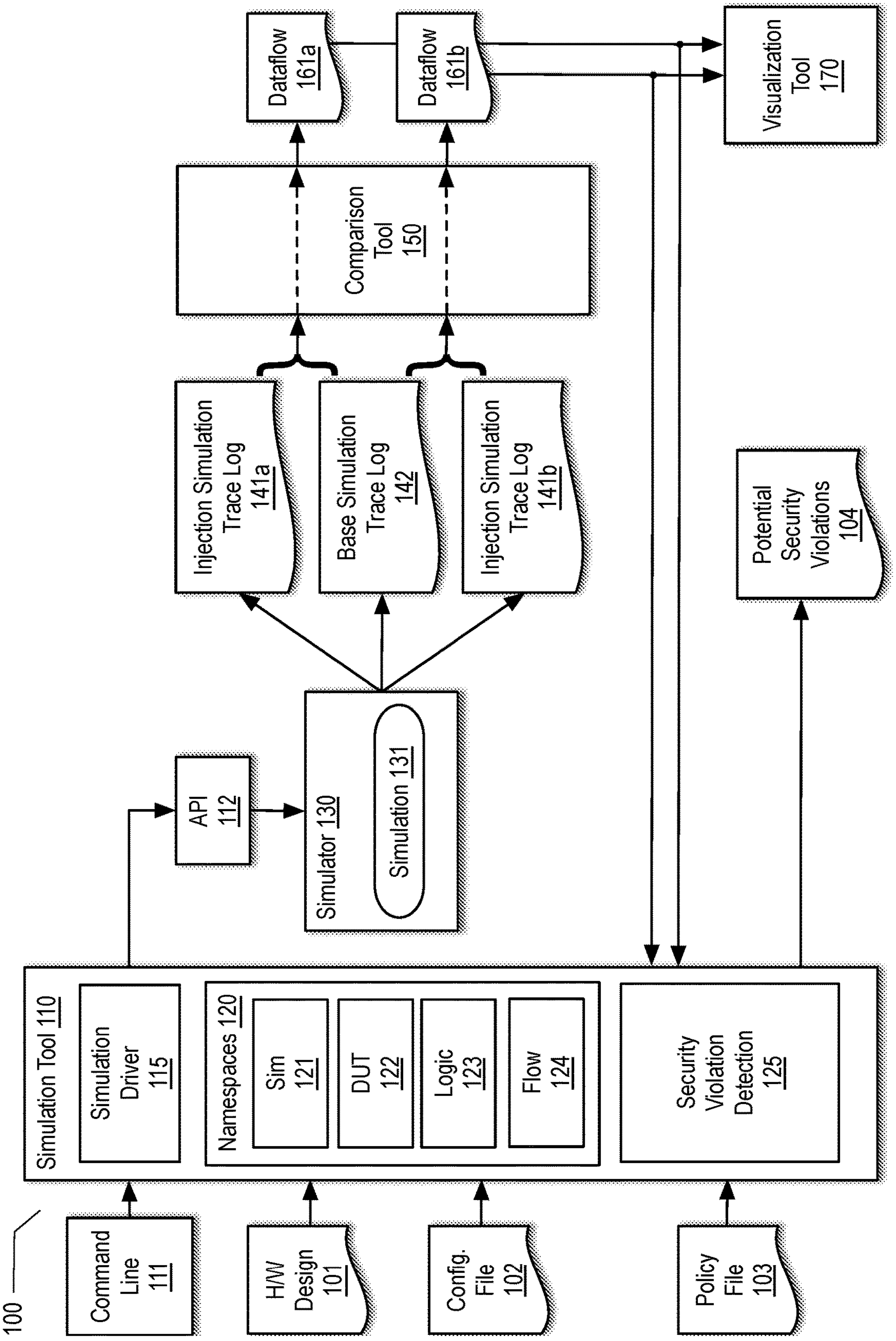
FIG. 1 is a block diagram illustrating an operational environment supporting detection of potential security issues in a hardware design according to some embodiments.

Embodiments described herein are generally directed to detecting security issues in a hardware design using IFT. Current IFT techniques suffer from some combination of low performance, high complexity (e.g., hard to integrate), low precision (e.g., allow over-estimation), and low expressive power (e.g. do not allow for complex violation conditions to be expressed). Additionally, most existing IFT approaches work by instrumenting the hardware description language (HDL) used to model electronic systems (e.g., a central processing unit (CPU) core and/or other digital circuits). Such instrumentation produces high overhead and leads to over tainting (e.g., dataflow is over approximated). Furthermore, these instrumentation-based approaches have high complexity of implementation and produce security error false positives.

Various embodiments described herein seek to address or at least mitigate one or more of the limitations of existing IFT techniques for various use cases. For example, the proposed approach for identification of security issues detects information flows (or dataflows) without requiring modification of the HDL code representing the hardware design. As described further below, the proposed solution may deduce the dataflows by comparing an unmodified simulation to an alternative simulation during which the RTL signal values are altered at the start of a given dataflow, which may be specified in terms of arbitrary logical conditions, for example, involving, among other things, simulation variables, signals of the design under test (DUT) (e.g., signal comparisons and signal transitions), and protocol state as reflected by protocol-level analysis performed by logic code associated with a logic namespace of a simulator tool that drives a simulator and evaluates simulation results output by the simulator. According to one embodiment, a dataflow specification is received indicative of a dataflow of a taint source within a hardware design to be evaluated. A first simulation result (e.g., a simulation trace log) for a first RTL simulation of the hardware design is obtained by causing a simulator to perform the first RTL simulation. A second simulation trace log for a second RTL simulation of the hardware design is obtained by causing the simulator to perform the second RTL simulation during which the taint source is altered based on the dataflow specification. The dataflow can then be identified based on a comparison between the first simulation trace log and the second simulation trace log. For purposes of generating or logging error or warning messages, for each signal of a multiple signals in the hardware design, flow metadata may be generated indicative of whether the signal or a portion thereof is part of the dataflow at one or more instances of simulated time based on the first simulation trace log and the second simulation trace log. Finally, a potential security issue within the hardware design may be detected by applying one or more policies to the flow metadata.

While various examples are described herein in which the result of one baseline simulation is compared to each of a set of one or more injections simulations or are collectively used to generate the flow metadata, it is to be appreciated an alternative approach may involve the use of two injection simulations in place of the combination of a baseline simulation and a given injection simulation.

While for sake of completeness a number of example policies are described herein for detecting violations that are likely indicative of security issues (e.g., mixed dataflows, double read of a given dataflow, and invalid dataflow) within a given hardware design, it is to be appreciated the security issue detection approach described herein is not limited to these specific examples. Rather, the expression of policies described herein is flexible and given expert knowledge of a given hardware design and/or associated potential security issues may be readily extended to detect violations indicative of a variety of other security issues.

In the following description, numerous specific details are set forth in order to provide a thorough understanding of example embodiments. It will be apparent, however, to one skilled in the art that embodiments described herein may be practiced without some of these specific details.

Terminology

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, a "simulator" generally refers to an HDL simulator that simulates expressions written in an HDL (e.g., Very High Speed Integrated Circuit (VHSIC) Hardware Description Language (VHDL), Verilog, or System Verilog). Non-limiting examples of a simulator include Verilog Compiler and Simulator (VCS) available from Synopsis, Inc. of Mountain View, CA, Incisive Enterprise Simulator available from Cadence Design Systems, Inc. of San Jose, CA, ModelSim and Questa Sim available from Siemens EDA (formerly Mentor Graphics) of Wilsonville, OR, and Verilator available from Veripool.

As used herein, a "taint source" generally refers to the start of a dataflow desired to be tracked within a hardware design. Non-limiting examples of a taint source include a particular signal, register, or buffer within the hardware design.

A "start event" generally refers to a moment in a simulation of a hardware design or a period during the simulation. The start event may be expressed as a logical condition or expression on the simulation.

As used herein, a "dataflow specification" generally refers to an RTL dataflow tracking primitive that specifies a particular dataflow that is of interest in terms of at least a start event (e.g., a starttime field of the dataflow specification) and a taint source (e.g., specified by a track field of the dataflow specification). The dataflow specification may use Javascript Object Notation (JSON) syntax or the like. In various examples described herein, a dataflow specification may include a number of additional fields including one or more of a flow identifier (ID) (e.g., flowid), an end event (e.g., endtime), arbitrary pre-processing logic (e.g., logic_pre) in the form of Turing-complete code that is to be run before evaluating the start event, arbitrary post-processing logic (e.g., logic_post) in the form of Turing-complete code that is to be run after every step of the simulation, and initialization logic (e.g., logic_init) to be evaluated one per dataflow specification, for example, for purposes of initializing objects in a logic namespace.

As used herein, a "dataflow" generally refers to the propagation of (processed) data through a hardware design that originates from a taint source. For purposes of illustration, B is part of a dataflow whenever:

A is part of the dataflow; and

The value of B is influenced by the value of A.

As used herein "simulation results" or a "simulation trace log" generally refer to information indicative of the state of a simulation over a period of time. Non-limiting examples of a simulation trace log include a fast signal database (FSDB) file or a value change dump (VCD) file containing the full state of a simulation at every instant of the simulation in simulated time. FSDB is a binary file format representing a simulation output produced by VCS, whereas VCD is a file format representing a simulation output common among open source simulators. Those skilled in the art will appreciate there are several other file formats in which simulation output is stored; therefore, reference to a simulation trace log or simulation results herein should not be limited to any particular file format.

As used herein "a user-facing signal" or "user-facing sink" generally refers to a signal at an interface of a particular component in the hardware design that holds values that end up in other components of the hardware design. As a non-limiting example, a signal holding a value leaving an I/O unit and being placed in a last-level cache (LLC) may represent a user-facing signal. Some of these user-facing sinks may be particularly interesting as they may be observable by an adversary, or interface with a less-trusted component of the hardware design, or because there may be a potential for them to leak stale data. As a result, such signals may be good targets on which to apply the dataflow policies described herein for purposes of detecting potential security issues.

As used herein "mixed dataflows" generally refers to a situation in which two or more dataflows are present in the same intermediate register at the same time, when such a register is intended by design to hold data from a single request, corresponding to a single flow. According to one embodiment, once the dataflows are known, this may be tested by parsing and analyzing the simulation results in a step-by-step manner, and at each step, determining which dataflow flowids have been recorded at that instant in a target register. If there is more than one, we have detected a mixed data flow. Depending on the design, this may be harmless, a warning, or an error.

As used herein a “double read” generally refers to a situation in which a particular dataflow is copied more than once, for example, to a user-facing sink or other signal that is a target of a policy (which may also be referred to herein as a dataflow policy). Depending on the hardware design at issue, a double read of a dataflow may represent a stale data error.

As used herein an “invalid dataflow” generally refers to a situation in which no dataflow is expected beyond a source signal from which the dataflow originates, but the dataflow is observed in a signal other than the source signal.

As used herein a “stale data condition” or a “stale data error” generally refers to a situation in which a double read or an invalid dataflow has occurred within a hardware design. Mixed dataflows can also be the result of a stale data error.

The terms “module,” “component”, “platform”, “tool,” “environment,” “system,” “manager” and the like as used herein are intended to refer to a computer-related entity, either a software-executing general purpose processor, hardware, firmware, or a combination thereof. For example, a module or a component may be, but is not limited to being, a process running on a compute resource, an executable, a thread of execution, a program, and/or a computer.

Overview

In accordance with various embodiments, a user may provide a list of taint sources, along with a simulation environment (e.g., a simulator) and a simulator command line. The simulator command line may be invoked multiple times, resulting in one baseline simulation of a hardware design under test, during which no intervention takes place, and one injection simulation of the hardware design under test for each taint source (dataflow), during which a simulation tool driving the simulation environment alters the value of the taint source during a specified period in simulation time. By comparing or otherwise parsing and analyzing the outputs (referred to herein as simulation results or simulation trace logs) of the simulation runs, the dataflows associated with each taint source can be deduced and policies can be applied to the dataflows, for example, based on flow metadata relating thereto to detect potential security violations.

In various examples described herein, there are three general stages performed by the proposed approach for identification of security issues within a hardware design, including (i) execution of multiple RTL simulations, (ii) generation of flow metadata, and (iii) application of policies to the flow metadata to detect potential security issues. In one embodiment, the first stage (execution of multiple RTL simulations) includes execution of a baseline simulation and persisting the simulation data (e.g., the simulation results or a simulation trace log in the form of an FSDB file or similar output) that records the signal values of each of the taint sources during respective starting periods of the corresponding dataflows. The baseline simulation represents a simulation of the hardware design during which no alterations are made to any of the taint sources, thereby providing a baseline to which one or more subsequent injection simulations, in which individual taint sources are altered, may be compared. In one embodiment, for each taint source a single corresponding injection simulation is executed after completion of the baseline simulation. During a given injection simulation, the simulator is interrupted at the chosen starting period of the dataflow and a value or multiple values, as the case may be, are injected (e.g., written or forced as appropriate) into the taint source signal. Specifically, the injected value(s) may represent the negated value(s), as captured by the baseline simulation trace log, that the taint source held during the chosen starting period of the dataflow. The injection simulations may be run in parallel as they are independent of each other and all record their respective simulation data, for example, by producing an FSDB file or similar output.

As an alternative to executing one baseline simulation and one injection simulation for each taint source during the first stage, the baseline simulation may be skipped and two injection simulations may be run for a given taint source. In this alternative scenario, the value zero (or a different value) may be injected in one simulation (which could then be viewed as the baseline simulation), and the negation of zero (or the different value) may be injected in the other simulation. If there is only one taint source (i.e., there is a desire to follow only one dataflow) this option is more time efficient as the two injection simulations may be performed in parallel without the need for waiting for completion of the baseline simulation.

Turning now to the second stage (generation of flow metadata), the results of the RTL simulations may be parsed and analyzed for each signal of multiple signals in the hardware design to generate flow metadata indicative of whether the signal or a portion thereof (e.g., a set of one or more bits of the signal) is part of the dataflow at one or more instances of simulated time. The second stage may include comparing the results of the RTL simulations in which the baseline simulation trace log is compared to each injection simulation trace log. That is, the number of comparisons performed is equal to the number of taint sources that have been defined. The difference between the baseline simulation and an injection simulation must denote the dataflow from the corresponding taint source, as this is the only signal in the hardware design whose value has been actively changed (injected). The comparisons can be run in parallel. Existing tools (e.g., nCompare available from Synopsis, Inc. of Mountain View, CA) may be used to perform the comparisons.

During the third stage (application of policies to the flow metadata to detect potential security issues), policy violations may be detected that are likely to indicate security issues in the hardware design. For example, policies specified by a user, for example, in the form of policy check code expressed in terms of a condition or expression involving, among other things, the flow metadata, design-specific variables (e.g., signals in the hardware design), and/or simulation-specific variables (e.g., simulation time) that, when evaluated to true represent a violation. In one embodiment, a flexible policy specification approach is proposed that allows a user with expert knowledge of the hardware design at issue to define Turing-complete code in a python-like syntax for identification of any undesirable dataflow within the hardware design.

A non-limiting example of an operational environment including functional units that may perform the three general stages of the proposed approach for identification of security issues within a hardware design are described below with reference to FIG. 1.

Example Operational Environment

FIG. 1 is a block diagram illustrating an operational environment 100 supporting detection of potential security issues in a hardware design according to some embodiments. According to one embodiment, the proposed approach for identification of security issues within a hardware (H/W) design (e.g., H/W design 101) involves detection of dataflows without modifying the HDL design in which the hardware design is represented. As a result, the implementation and maintenance burden is very low.

As described further below, instead of relying on instrumentation of the HDL, the proposed approach receives external input (e.g., configuration file 102) containing information regarding multiple taint sources, in which each taint source represents the starting point of its own dataflow and each taint source is specified as part of a dataflow specification including, among other fields, a start time (e.g., representing a start event) that may be expressed in terms of arbitrary logical conditions involving, among other things, signal comparisons, single-bit signal values, and/or signal transitions. A given taint source may be identified by its set of one or more bits in a signal and a specified period or moment in simulation time (the start time). As a non-limiting example, the start event may be defined by a signal value change (e.g., a period between the rising edge and falling edge of a specified signal). Other examples of start events are described further below. A given taint source is actively tainted during the specified period or moment within the associated RTL simulation (e.g., simulation 131).

In one embodiment, a base RTL simulation may be run during which the signal values of the taint sources are recorded while the expression representing the start event for the corresponding dataflow is true. Following the base RTL simulation, an injection RTL simulation may be run for each taint source in which the value of the taint source is altered. Then, the recorded simulation data (e.g., injection simulation trace log 141*a-b*) for each injection RTL simulation may be compared to the recorded simulation data (e.g., base simulation trace log 142) for the base RTL simulation. The base RTL simulation and each injection RTL simulation may then be compared to reveal the dataflow for the taint source altered in the respective injection RTL simulations. As those skilled in the art will appreciate, the difference between the base RTL simulation and a given injection RTL simulation is indicative of the dataflow (e.g., one of dataflows 161*a-b*) from the corresponding taint source, as this is the only signal in the hardware design whose value was actively changed (via injection) and simulation is assumed to be deterministic.

As illustrated by various examples described below, as a result of user-defined flow IDs and/or the automatic generation of a corresponding unique flow ID, each dataflow is perfectly distinguishable from other dataflows, even if they overlap or have identical data in them. By identifying such dataflows in time, an external input (e.g., policy file 103) containing information regarding a set of one or more policies specifying conditions that are likely to be indicative of security issues in the hardware design can be applied to the dataflows (or more specifically, flow metadata relating thereto) to identify the existence of such security issues. Non-limiting examples of security issues that may be identified include stale data bugs (indicated by mixed dataflows or double read of a dataflow), invalid dataflow, and other similar microarchitecture information leaks. In view of the flexibility of specifying such policies as described and illustrated below, with expert knowledge of a particular hardware design, associated potential security issues that may arise in the context of the particular hardware design, and/or potential security issues that represent a matter of concern in the context of the particular hardware design, it is to be appreciated a variety of other potential security issues may be identified based on policies specified based on such expert knowledge.

The operational environment is shown including a simulation tool 110, which receives external inputs including a command line 111, the hardware (H/W) design 101, the configuration file 102, and the policy file 103. Non-limiting examples of the configuration file 102 and the policy file 103 are described further below with reference to FIGS. 4-6. The operational environment 100 further includes a simulator 130 (e.g., VCS or other simulator) that may be driven through an application programming interface (API) 112. In the context of the present example, the simulation tool 110 is responsible for deciding which simulations of the H/W design 101 are to be run by the simulator 130 and manages how such simulations are run by the simulator 130.

The simulation tool 110 includes a simulation driver module 115, namespaces 120, and a security violation detection module 125. The simulation driver module 115 may be responsible for driving the simulator 130 to perform the first stage (e.g., execution of multiple RTL simulations) described above in the overview section. According to one embodiment, the simulation driver module 115 drives the simulator 130 via the API 112 (e.g., Verilog Procedural Interface (VPI) or the like) based on the dataflow specifications, for example, contained within the configuration file 102. For example, the simulation driver 115 may cause the simulator 130 to perform various simulations (e.g., simulation 131), including, for instance, a baseline RTL simulation and/or one or more injection RTL simulations resulting in the output of various corresponding trace logs (e.g., injection simulation trace log 141*a-b* and/or base simulation trace log 142).

In the context of the present example, the namespaces 120 include a sim namespace 121, a DUT namespace 122, a logic namespace 123, and a flow namespace 124. The sim namespace 121 may include simulation-specific variables and when included within various code (e.g., logical expressions) and/or conditions may be prefixed with "sim." Non-limiting examples of simulation-specific variables include:

sim.time: representing the number of simulated timesteps or ticks since the start of the simulation at issue.

sim.flowduration: representing the number of simulated timesteps or ticks since the start of a given dataflow.

sim.flowstarttime: representing the value of sim.time at the start of a given dataflow.

sim.flownumber: representing the number of times the given dataflow specification has caused a dataflow to start during the simulation at issue.

The DUT namespace 122 may include design-specific variables (e.g., signal values) and may be prefixed with "dut."

As described further below, objects or variables in the logic namespace 123 may be used by logic code contained within a dataflow specification (e.g., contained within the logic_pre field, the logic_post field, and/or the logic_init field), for example, to monitor and persist historical state information. Variables in the logic namespace may be prefixed with "logic." and may also be accessed by the starttime and/or endtime fields of the dataflow specification.

As described and illustrated by various examples below, code and/or conditions expressed within a given dataflow specification, for example, within the starttime field, the endtime field, the logic_init field, the logic_pre field, and/or the logic_post field can reference simulation-specific variables or design-specific variables.

The flow namespace 124 may include flow metadata associated with each signal of multiple signals in the hardware design or a portion thereof (e.g., a set of one or more bits of the signal) at one or more instances of simulated time. According to one embodiment, the flow metadata may be generated by processing of the injection simulation trace logs (e.g., injection simulation trace logs 141*a-b*) by the security violation detection module 125. The flow metadata may include, among other metrics and/or variables, a set of one or more flowids of corresponding dataflow(s) that is/are present within the signal or portion thereof at a given instance of simulated time.

The operational environment 100 further includes a comparison tool 150 and a visualization tool 170. The comparison tool 150 may be responsible for performing the second stage (e.g., comparing the results of the RTL simulations) as described above in the overview section. According to one embodiment, the comparison tool 150 (e.g., nCompare available from Synopsis, Inc. of Mountain View, CA or other similar comparison tool) may be operative to receive two simulation trace logs (e.g., the base simulation trace log 142 and one of the injection simulation trace logs 141*a* or 141*b*) at a time and output the difference between the two input simulation trace logs. As noted above, the different between the two input simulation trace logs is indicative of the dataflow (e.g., dataflow 161*a* or dataflow 161*b*) from the corresponding taint source. In one embodiment, the visualization tool 170 (e.g., the Verdi Automated Debug System available from Synopsis, Inc. of Mountain View, CA or a similar visual debug system) may be used to present a visual depiction of the dataflows 161*a-b* in which each dataflow is represented by a particular color. For example, assuming dataflows from two taint sources are tracked, the data associated with one dataflow may be presented within the visualization tool 170 in red and the data associated with the other dataflow may be presented in blue. In this manner, the existence of mixed dataflows may be identified by observing purple (a mix of red and blue), whereas strict separation of the colors would be indicative of no mixed dataflows.

Returning to the simulation tool 110, the security violation detection module 125 may be responsible for performing the third stage (e.g., application of policies to the flow metadata to detect potential security issues) as described above in the overview section. According to one embodiment, the security violation detection module 125 processes or causes the recorded injection simulation data (e.g., the injection simulation trace logs 141*a-b*) to be processed (e.g., by comparison tool 150) and assembles them into a single logical simulation having the same signal values as the base simulation trace log 142. The processing of the recorded injection simulation data includes parsing and analyzing the recorded simulation data so as to allow generation of flow metadata associated with each bit in each signal at every instance of the simulation. For example, the flow metadata may be indicative of whether or not the particular bit is part of any dataflows, and if so, which ones. With this information, powerful policies can be formulated and user-defined error or warning messages may be logged, for example, to a potential security violations file 104 as described further below.

In the context of the present example, the simulation tool 110, the command line 111, the API 112, the simulator 130, the comparison tool 150, the visualization tool 170 and the processing described below with reference to FIG. 2 may be implemented in the form of executable instructions stored on a machine readable medium and executed by a processing resource (e.g., a microcontroller, a microprocessor, central processing unit core(s), an application-specific integrated circuit (ASIC), a field programmable gate array (FPGA), and the like) and/or in the form of other types of electronic circuitry. For example, the processing may be performed by one or more virtual or physical computer systems of various forms (e.g., a server, a workstation, a personal computer, a laptop, or the like), such as the computer system described below with reference to FIG. 10.

Example Detection of Potential Security Issues with IFT

Figure 2:
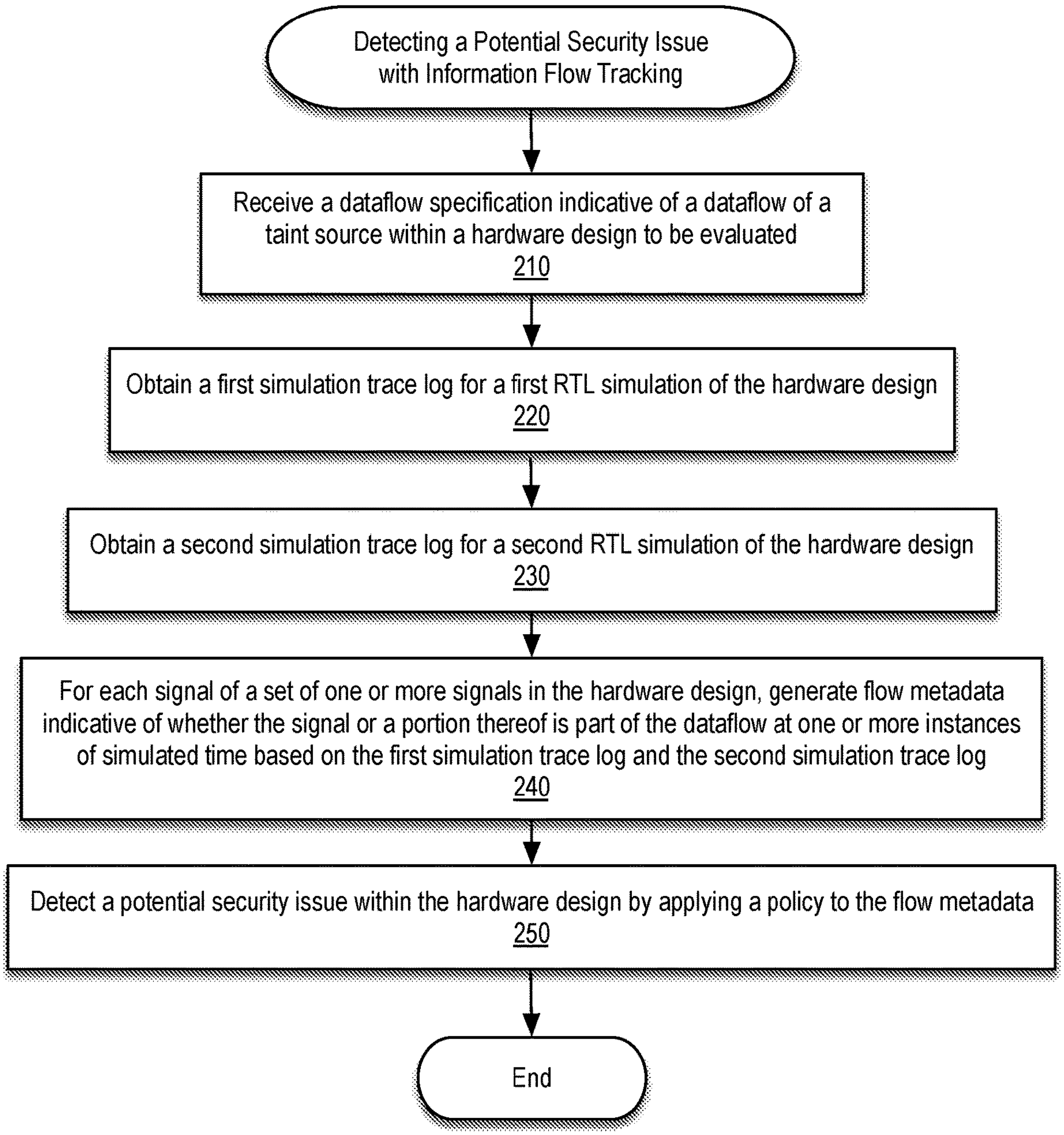
FIG. 2 is a flow diagram illustrating operations for performing detection of potential security issues with information flow tracking (IFT) according to some embodiments.

FIG. 2 is a flow diagram illustrating operations for performing detection of potential security issues with information flow tracking (IFT) according to some embodiments. The processing described with reference to FIG. 2 may be performed by a simulation tool (e.g., simulation tool 110).

At block 210, a dataflow specification is received that is indicative of a dataflow of a taint source within a hardware design to be evaluated. The dataflow specification may be created by or on behalf of a user of the simulation tool and contained in a configuration file (e.g., configuration file 102). The hardware design (e.g., hardware design 101) represents a digital design for which the existence of various security issues is desired to be evaluated. The hardware design may be expressed in an HDL that is used to model electronic systems (e.g., a CPU core and/or other digital circuits). Examples of dataflow specifications and various fields that may be used to define a dataflow specification are described further below with reference to FIGS. 4 and 5.

At block 220 a first simulation trace log is obtained for a first RTL simulation of the hardware design. For example, the simulation tool may cause a simulator (e.g. simulator 130) to run a baseline simulation of the hardware design during which no intervention takes place and for which a simulation trace log (e.g., base simulation trace log 142) is generated.

At block 230 a second simulation trace log is obtained for a second RTL simulation of the hardware design. The simulation tool may cause the simulator to run an injection simulation of the hardware design during which the simulation tool alters the value of the taint source at a moment or during a period of simulation time in which the start event evaluates to true. For example, during execution of the injection simulation, the simulation tool may monitor the simulation time and interrupt the simulator at the chosen starting period of the dataflow and a value or multiple values, as the case may be, are injected (e.g., written or forced as appropriate) into the taint source signal. In one embodiment, the injected value(s) may represent the negated value(s) held by the taint source during the chose starting period of the dataflow as previously captured within the baseline simulation trace log. As part of the execution of the injection simulation, the simulator should also generate a simulation trace log (e.g., one of injection simulation trace log 141*a* or 141*b*).

At block 240, flow metadata is generated for each of a set of one or more signals in the hardware design, for example, a subset of signals in the hardware design or all signals in the hardware design. The flow metadata may be persisted to a flow namespace (e.g., flow namespace 124) that is subsequently utilized during evaluation of a set of one or more user-defined dataflow policies, for example, contained in a policy file (e.g., policy file 103). According to one embodiment, after all injection simulations have been completed and respective injection simulation results (e.g., injection simulation trace log 141*a-b*) have been recorded, a security violation detection module (e.g., security violation detection module 125) may assemble the injection simulation results into a single logical simulation. This logical simulation may have the same signal values as the base simulation results (e.g., base simulation trace log 142) but each signal or portion thereof (e.g., a set of one or more bits of the signal) at every instance has flow metadata associated with it, for example, indicative of whether or not it is part of any dataflows, and if so, which ones as identified by their respective flowids. For example, the single logical simulation may be parsed and analyzed in a step-by-step manner, and at each step, metrics may be generated regarding which dataflow flowids were recorded at that instant in a given target register. Non-limiting examples of flow metadata include:

Flow.set.signalname[ ]: the set of flowids present in any bits of signalname[ ] (or a subset of these bits when used like signalname[63:0]).

Flow.seeded(flowid): the total number of bits seeded in dataflow corresponding to the flowid up until this moment in the simulation. The total number represents the cumulative number of bits that are modified in the injection simulation for the flowid up until this moment in the simulation.

Flow.size(flowid): total number of bits found in the dataflow (including the seeding) corresponding to the flowid up until this moment in the simulation.

Flow.signals(flowid): total number of unique signals in which the dataflow corresponding to the flowid is present.

Based on the flow metadata generated at block 240 alone and/or in combination with information maintained in one or more other namespaces (e.g., sim namespace 121, DUT namespace 122, and/or logic namespace 123), some powerful policies can be formulated to detect existence of potential security issues in the hardware design.

At block 250, a potential security issue within the hardware design may be detected by applying a policy to the flow metadata. For example, the security violation detection module may evaluate a logical condition or expression associated with the policy that when true is indicative of the existence of a potential security issue in the hardware design. Non-limiting examples of dataflow policies the violation of which may be indicative of a potential security issue in the hardware design include a mixed dataflow policy that detects the existence of a mixed dataflow, a double read policy that detects the existence of a double read of a dataflow, and an invalid dataflow policy that detects the existence of a dataflow in circumstances where there should be no dataflow. Examples of each of the aforementioned dataflow policies are described further below with reference to FIG. 6. Example timing diagrams illustrating dataflows in which the aforementioned dataflow policies are not violated and violated are described below with reference to FIGS. 7A-9B.

While in the context of the present example, only one dataflow specification is described for sake of brevity, it is to be appreciated multiple dataflow specifications may be processed. For each additional dataflow specification, the simulation tool may cause the simulator to run another injection simulation.

Example Dataflow

Figure 3:
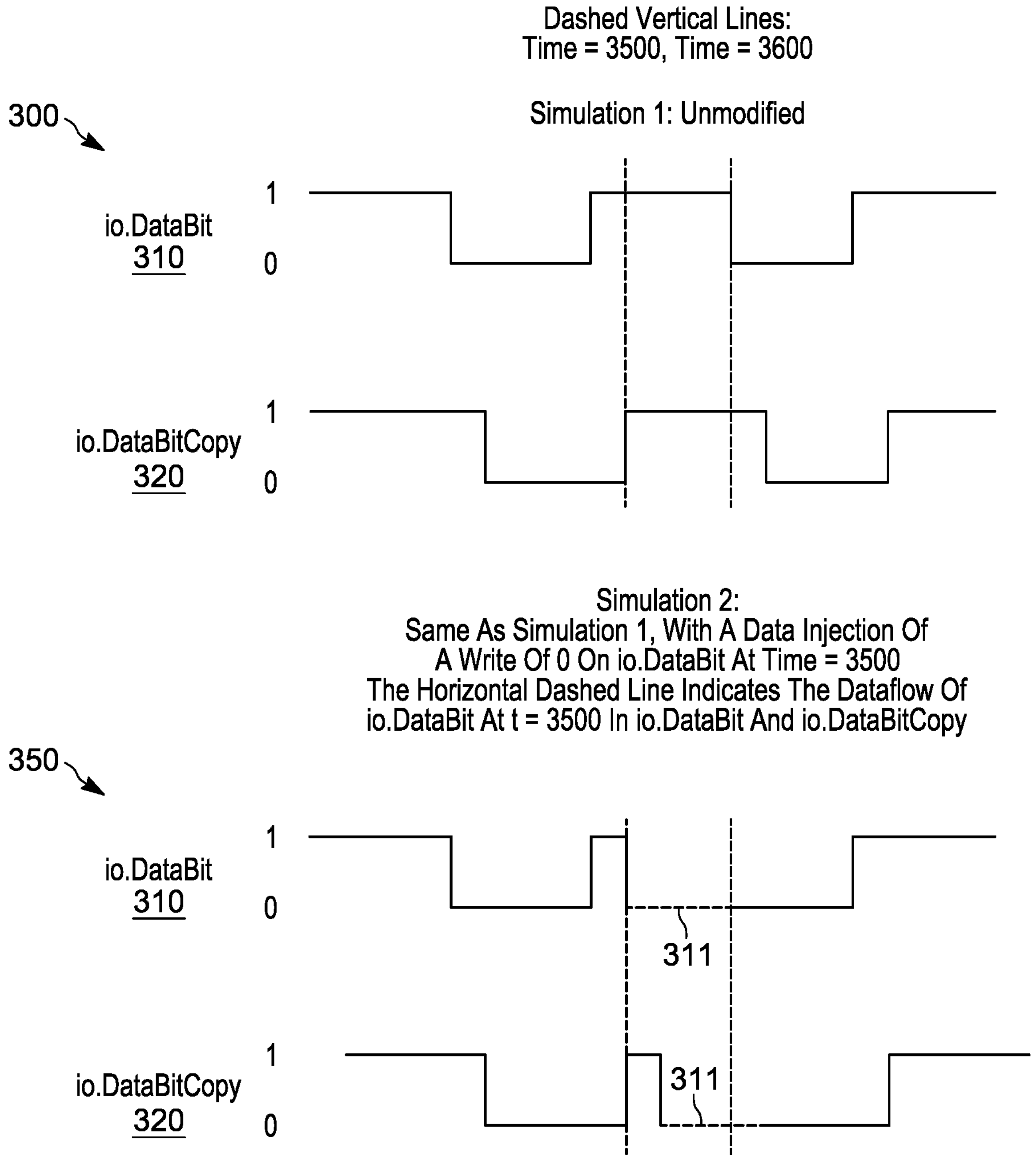
FIG. 3 shows two timing diagrams for purposes of illustrating the notion of a dataflow with reference to a base simulation and an injection simulation according to some embodiments.

FIG. 3 shows two timing diagrams for purposes of illustrating the notion of a dataflow 311 with reference to a base simulation 300 and an injection simulation 350 according to some embodiments. In the context of the present example, an io.DataBit signal 310 is copied with a small delay into an io.DataBitCopy signal 320. In this example, it is assumed a dataflow associated with io.DataBit 310 (the taint source) is to be tracked, for example, based on the following dataflow specification:

```
{ "starttime": "sim.time==3500", "track": "io.DataBit" }
```

In the above dataflow specification, whenever the condition (the start event) "sim.time==3500" is true, the flow of the single-bit data present in the signal io.DataBit 310 should be followed for the remainder of the simulation. In other words, at time=3500 ticks, the flow will start.

According to one embodiment, this flow may be found by first running an unmodified simulation (e.g., the base or baseline simulation 300) and saving a full trace representing the simulation results (e.g., base simulation trace log 142). Then, a second simulation (the injection simulation 350) is run and during the second simulation at simulation time==3500 ticks, the bitwise inverse value of what is presently in io.DataBit 310 is written back into io.DataBit 310. In this example, as io.DataBit is 1 at time==3500, a 0 is written to io.DataBit 310. Then, the injection simulation 350 continues unperturbed. The injection simulation 350 also saves a full trace representing the simulation results (e.g., injection simulation trace log 141*a* or 141*b*).

In this example, it can be seen that io.DataBit 310 is changed from 1 to 0 at t=3500 in the injection simulation 350 due to the injection of data using a write. This starts the dataflow. Once the original transition to 0 of io.DataBit 310 would have occurred at t=3600 in the base simulation 300, the value of io.DataBit 310 in the injection simulation 350 remains at 0 and the signal resumes its normal behavior. Similarly, io.DataBitCopy 320 mirrors its new behavior with a slight delay (without receiving any injection itself). The dashed horizontal lines in io.DataBit 310 and io.DataBitCopy 320 in the injection simulation 350 represent the differences that each signal sees with respect to the base simulation 300, and precisely represent the dataflow of the 1-bit in io.DataBit 310 at t=3500. That is, the 1-bit remains in io.DataBit 310 until time==3600, and then flows to io.DataBitCopy 320 with a slight delay. The dataflow disappears first from io.DataBit 310, and then with the same delay, from io.DataBitCopy 320.

Example Dataflow Specifications

Figure 4:
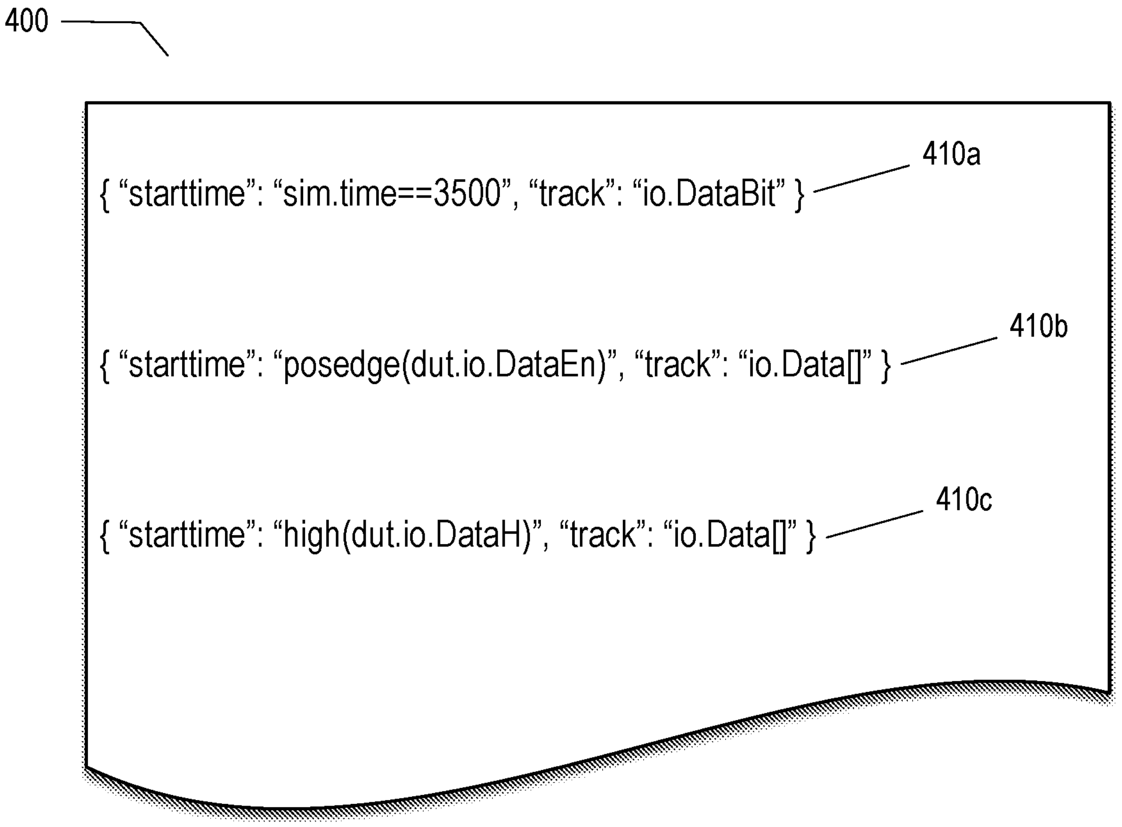
FIG. 4 is a block diagram illustrating examples of dataflow specifications that may be included within a configuration file according to some embodiments.

FIG. 4 is a block diagram illustrating examples of dataflow specifications 410*a-c* that may be included within a configuration file 400 (which may be analogous to configuration file 102) according to some embodiments. A given dataflow specification, for example, contained within the configuration file 400 or another data source may be represented as a number of fields (e.g., using JSON syntax) to specify a dataflow. In one embodiment, a given dataflow specification includes at least the following fields:

Starttime: a moment or period in the simulation (expressed by condition on the simulation), which may also be referred to herein as a "start event."

Track: the data (or taint source) the flow of which is to be tracked or followed through the hardware design (e.g., hardware design 101).

The example dataflow specification 410*a* was described above with reference to FIG. 3 and represents a static condition that does not depend on any hardware design signal values. Dataflow specifications 410*b-c* illustrate non-limiting examples of dynamic conditions that may be expressed within the starttime field. For example, the starttime field of dataflow specification 410*b* indicates on every rising edge of the single-bit signal 'dut.io.DataEn,' a new dataflow should be initiated in the 'io.Data[ ]' signal. io.Data[ ] is a multi-bit signal whose width is implicit in the dataflow specification (but given by the hardware design).

The above-described condition with reference to dataflow specification 410*b* specifies a single instant as starttime. During a corresponding injection simulation, this condition will result in a single write to the io.Data[ ] signal at each rising edge of the 'dut.io.DataEn' signal.

Turning now to dataflow specification 410*c*, it is illustrated that a given dataflow specification can also specify a period of time, rather than an instant. Dataflow specification 410*c* indicates that as long as dut.io.DataH is high, the data flowing out of io.Data[ ] is to be followed and is to be regarded as a single dataflow. In this case, the condition expressed by the starttime field does not represent a single starttime, but rather potentially a range of times at which the condition is evaluated as true. During the corresponding injection simulation, the corresponding data is forced to its bitwise inverse value for as long as the condition is true, in this case, while dut.io.DataH is high. This forced inverse changes to a new inverse whenever the original data changes.

While in the three example dataflow specifications 410*a-c* only starttime and track fields are defined, it is to be appreciated one or more additional fields may be utilized to represent a given dataflow specification. In one embodiment, the following additional fields may optionally be included as part of a given dataflow specification:

- Flowid: an identifier (ID) that can be used to distinguish between multiple dataflows. Different IDs may be specified, or flowids may be merged, for example, by specifying the same ID for multiple conditions. According to one embodiment, if an ID is not specified, each dataflow that is triggered by the starttime condition will be assigned a unique autogenerated ID.
- Endtime: specifies an artificial limit to the dataflow. This field may have the same format as the starttime field. The code or conditions expressed in this field have access to the 'sim.flowstarttime' and 'sim.flowduration' variables. According to one embodiment, if an endtime is not specified, no limit is applied to the dataflow.
- Logic_pre: allows arbitrary, Turing-complete code to run before evaluating the 'starttime' condition at every simulation step, with access to all signals at every step. The code contained in the logic_pre field can read the signals within the DUT namespace 122 (e.g., the variables in the 'dut.' namespace) and can read and write its own state in the logic namespace 123 (e.g., variables in the 'logic.' namespace), thereby allowing computation and persistence of historically-aware conditions for use in the starttime and/or endtime fields.
- Logic_post: same as the logic_pre field but is executed after every step.
- Logic_init: executed once per dataflow specification. Used to initialize objects in the logic namespace 123.

As a non-limiting example, of how logic code might be used, the logic code may perform protocol-level analysis and allow starttime to access a variable that is only true when a particular protocol state is active, which requires historical observation of signals. As illustrated by various examples described below, the starttime condition can then access data in the logic namespace 123 and trigger dataflows using more complex conditions than what is available at the particular instant of the simulation at issue. While endtime is mostly an optimization, it is to be noted it may also influence violation detection. For example, after the endtime condition no event should be considered a violation as no dataflow will be detected.

Example Expressions for Specifying a Dataflow

FIG. 5 is a table 500 illustrating examples of logical conditions and expressions that may be used to specify a dataflow according to some embodiments. In the context of the present example, for purposes of illustration various non-limiting examples of code, logical conditions, and/or expressions that may be contained within a starttime field 510, a track field 520, a flowid field 530, and a logic field 540 (e.g., the logic_pre field) are described. For sake of brevity, the optional endtime, logic_post, and logic_init fields have been omitted.

A dataflow specification based on the fields of row 561 indicates whenever the Core.IO.ResponseValidEn signal goes from low to high (posedge), dataflow tracking should start on the contents of the Core.IO.ResponseData[ ] signal (width is implicit and specified in the hardware design). Every posedge of the dut.Core.IO.ResponseValidEn signal will generate a new flow (and a new injection simulation).

A dataflow specification based on the fields of row 562 indicates whenever and as long as Core.IO.ResponseValidH is high, dataflow tracking should start on the contents of the lowest 64 bits of Core.IO.ResponseData. every period of the Core.IO.ResponseValidH signal will generate a new flow (and a new injection simulation).

A dataflow specification based on the fields of row 563 indicates every time and as long as dut.Core.IO.ResponseValidH is low, dataflow tracking should start on the contents of Core.IO.ResponseData[ ]. In this example, all data injecting is done in a single injection simulation, because all flows have the same flowid of 0. All the merged dataflows arising from the injection are considered a single dataflow.

A dataflow specification based on the fields of row 564 is the same as row 562, but now at most 10 extra simulations will run, because every tenth dataflow will be merged together, as they all get the same flowid.

A dataflow specification based on the fields of row 565 indicates dataflow tracking on Core.IO.ResponseData[ ] is to be started but only after reset has completed and before simulation time of 1000, and only after more than 10 packets of type 23 have been seen and counted (as maintained by the logic block). Then, every rising edge of dut.Core.IO.ResponseValidEn constitutes a new dataflow with a new unique flowid.

Example Policies

Figure 6:
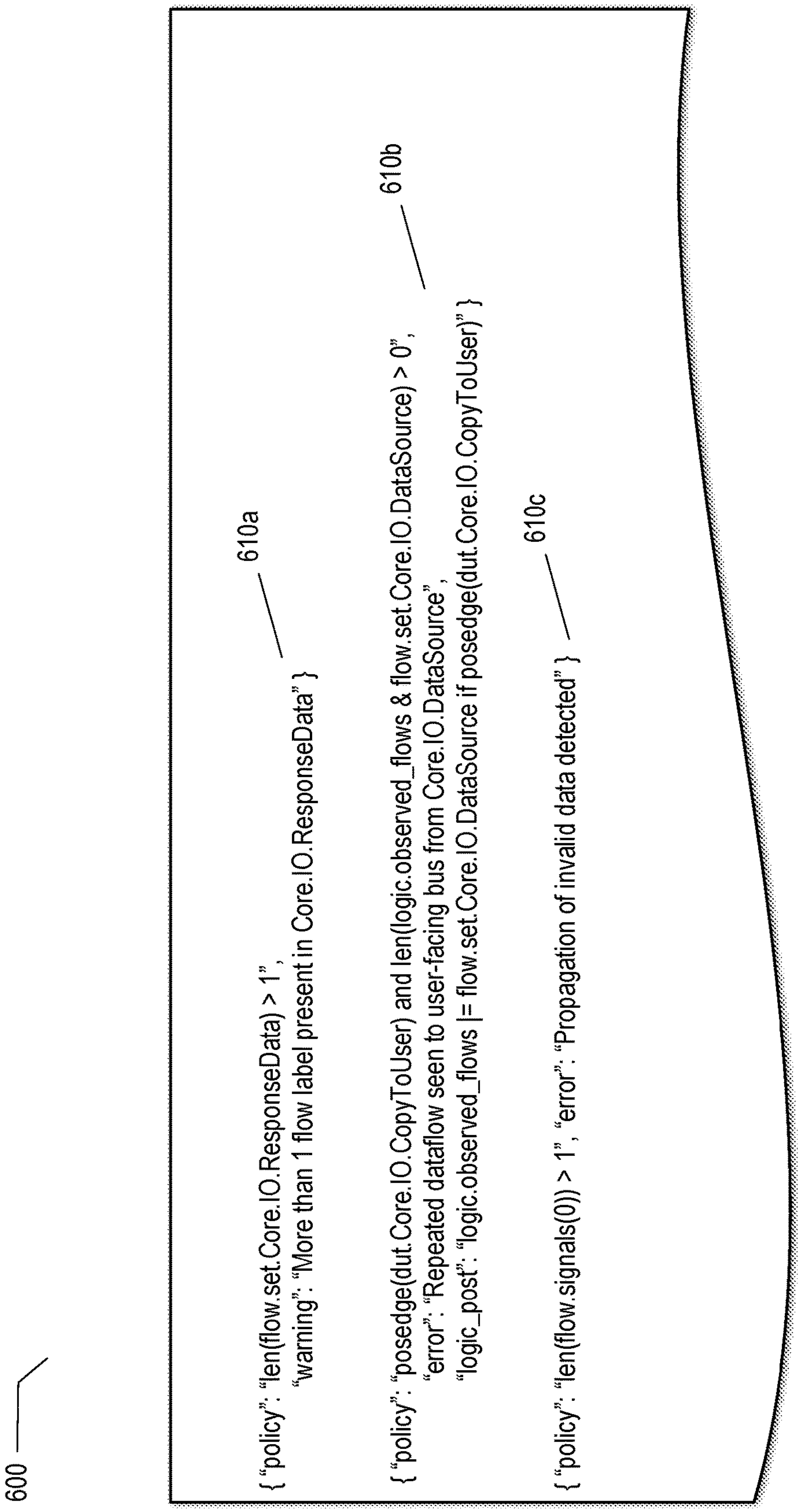
FIG. 6 is a block diagram illustrating examples of policies that may be included within a policy file according to some embodiments.

FIG. 6 is a block diagram illustrating examples of policies 610*a-c* that may be included within a policy file 600 (which may be analogous to policy file 103) according to some embodiments. In various examples described herein, fields that may be included in a policy include:

- Policy: condition that, when evaluated to true, is a violation.
- "warning" or "error": exactly one of these should be present. If "warning" is present, the policy violation throws a warning. If "error" is present, the policy violation throws an error.

Logic_init: code that is executed once before all evaluations (e.g., for initialization).

Logic: code that is executed before policy is evaluated.

Logic_post: code that is executed after policy is evaluated.

In one embodiment, the code in the logic fields (e.g., logic_init, logic, and logic_post) may be expressed in python-like syntax.

Turning now to the example policies 610*a-c*, example policy 610*a* represents an example of a mixed dataflows policy. In the context of the present example, the flow metadata flow.set.Core.IO.ResponseData represents the set of all flowids whose dataflow is present in any of the bits of the Core.IO.ResponseData signal. len(flow.set.Core.IO.ResponseData) represents the total number of unique flowids present in any of these bits.

This policy condition is evaluated conceptually at every time tick of the simulation based on post processing of the simulation results. If the condition is true at any time tick, this means that the set of flowids detected in the Core.IO-.ResponseData signal is more than 1, indicating data is present within the signal from more than 1 dataflow at the same time. This may be indicative of a stale data condition, as the full register might be visible to the user at some point. As this is design-dependent, and not certain to be an error, this policy throws a "warning" rather than "error".

Example policy 610*b* represents an example of a double read policy. This policy is about a digital design that, on every rising edge of dut. Core.IO.CopyToUser, copies data from Core.IO.DataSource to a user-facing bus. The logic code maintains a set of all dataflows that have ever been copied there, by adding the set of currently present flows (flow.set.Core.IO.DataSource) to the historical set (logic.observed_flows) on every rising edge of Core.IO.CopyToUser. The policy violation then occurs whenever (i) a dut. Core.IO.CopyToUser rising edge is seen; and (ii) the currently present flowids in the source register contain a flowid of a dataflow that has already been transmitted to the user in the past. This represents a stale data condition and is flagged as an error.

Example policy 610*c* represents an example of an invalid dataflow policy. The corresponding dataflow specification may be as follows:

```
{ "starttime": "low(dut.Core.IO.ResponseValidH)",
"track": "Core.IO.ResponseData", "flowid": "0" }
```

Based on the above dataflow specification, all dataflows from Core.IO.ResponseData whenever the valid signal (dut.Core.IO.ResponseValidH) is low are merged into flowid 0. The violation of the policy condition of policy 610*c* will occur whenever this data is copied from that data signal to another signal. This condition represents a bug, possibly causing functional errors, and possibly exposing stale data to the user if this bug is exploitable.

Example Timing Diagram with No Mixed Dataflows Policy Violation

Figure 7A:
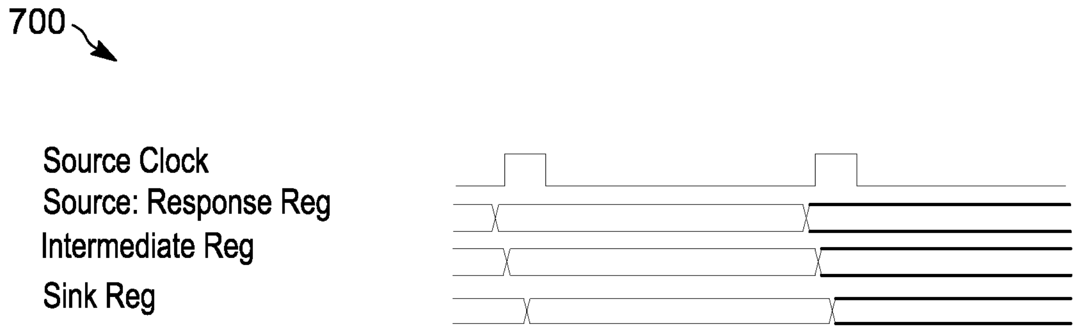
FIG. 7A is a timing diagram illustrating an example of two dataflows that do not violate a mixed dataflows policy according to some embodiments.

FIG. 7A is a timing diagram 700 illustrating an example of two dataflows that do not violate a mixed dataflows policy according to some embodiments. In the examples represented by FIGS. 7A-B, the mixed dataflows policy seeks to avoid conditions in which user-facing sinks in the hardware design hold data from more than one dataflow simultaneously. Assume for purposes of the present example, that the taint source (a source response register) contains data from an I/O response, and that a new dataflow is started for each I/O response, for example, responsive to the positive edge of a source clock indicating when the data in the source register is valid (which is when fresh data from an I/O response has arrived in the source register). If these I/O responses are mixed and sent together from one component to another component, it could be an indication of a stale data bug.

In this example, the two dataflows (a first dataflow shown in light grey and a second dataflow shown in black), follow two separate I/O responses from the source register (the taint source) to a sink register (a user-facing sink from which the data will leave to the core). As can be seen in this example, at any given time, each register contains either the first dataflow or the second dataflow, thereby resulting in no violation of the mixed dataflows policy.

Example Timing Diagram with a Mixed Dataflows Policy Violation

Figure 7B:
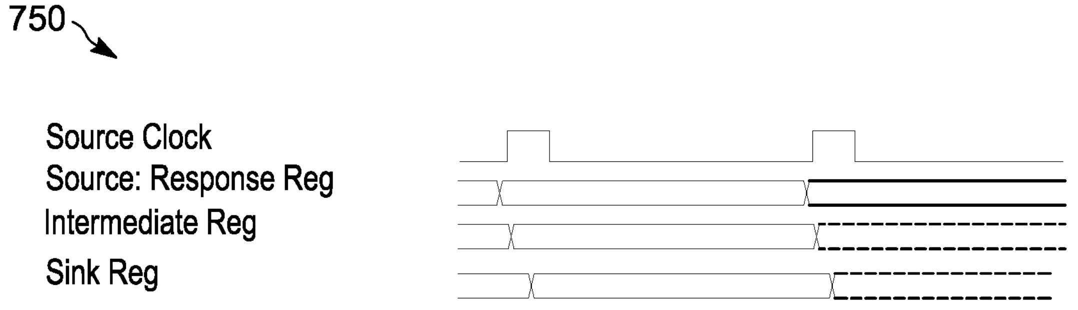
FIG. 7B is a timing diagram illustrating an example of two dataflows that violate the mixed dataflows policy according to some embodiments.

FIG. 7B is a timing diagram 750 illustrating an example of two dataflows that violate the mixed dataflows policy according to some embodiments. In this example, it can be seen that in the intermediate register, and later in the sink register, there is a mixture present of the first dataflow, and the second dataflow as indicated by the dashed line, for example, due to the data from the first I/O response (light grey) remaining in the intermediate register and the user-facing sink after the second I/O response (black) arrives, which is thus a stale data issue.

Example Timing Diagram with No Double Read Policy Violation

Figure 8A:
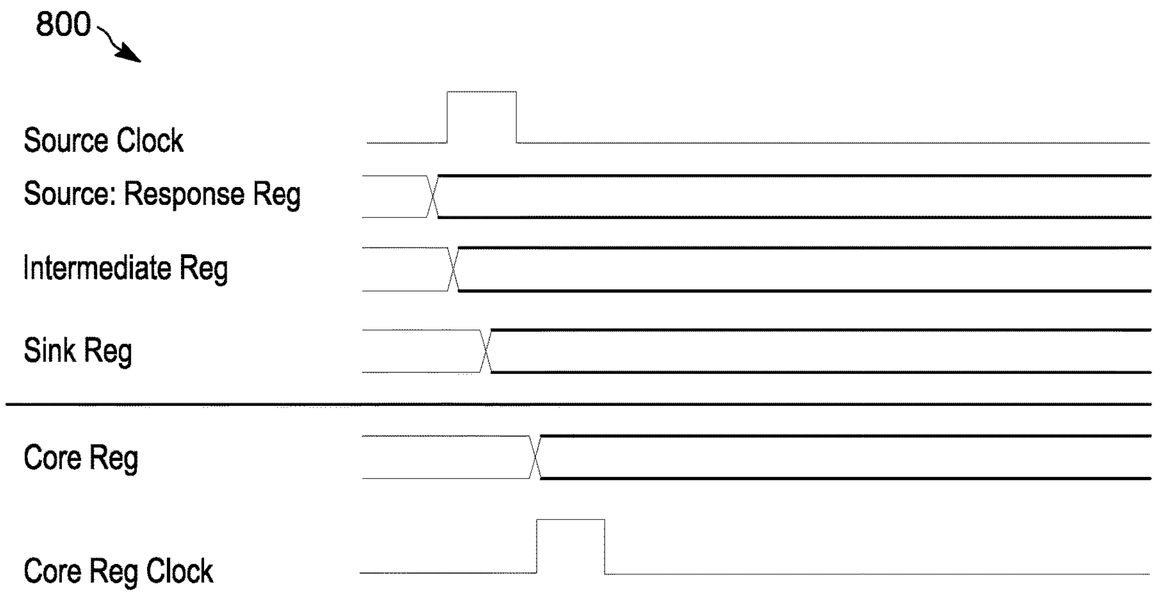
FIG. 8A is a timing diagram illustrating an example of a dataflow that does not violate a double read policy according to some embodiments.

FIG. 8A is a timing diagram 800 illustrating an example of a dataflow that does not violate a double read policy according to some embodiments. In the examples represented by FIGS. 8A-B, the double read policy seeks to avoid conditions in which a data leaves a user-facing sink in the hardware design more than once. Assume for purposes of the present example, that the taint source (a source response register) contains data from an I/O response, and that one such I/O response is followed (represented in black). If the I/O response is moved more than once from one component to another, then this could be an indication of a stale data bug. In this example, the double read policy is not violated as the data from the first I/O response (in green) moves only once from a user-facing sink to a register in the core.

Example Timing Diagram with a Double Read Policy Violation

Figure 8B:
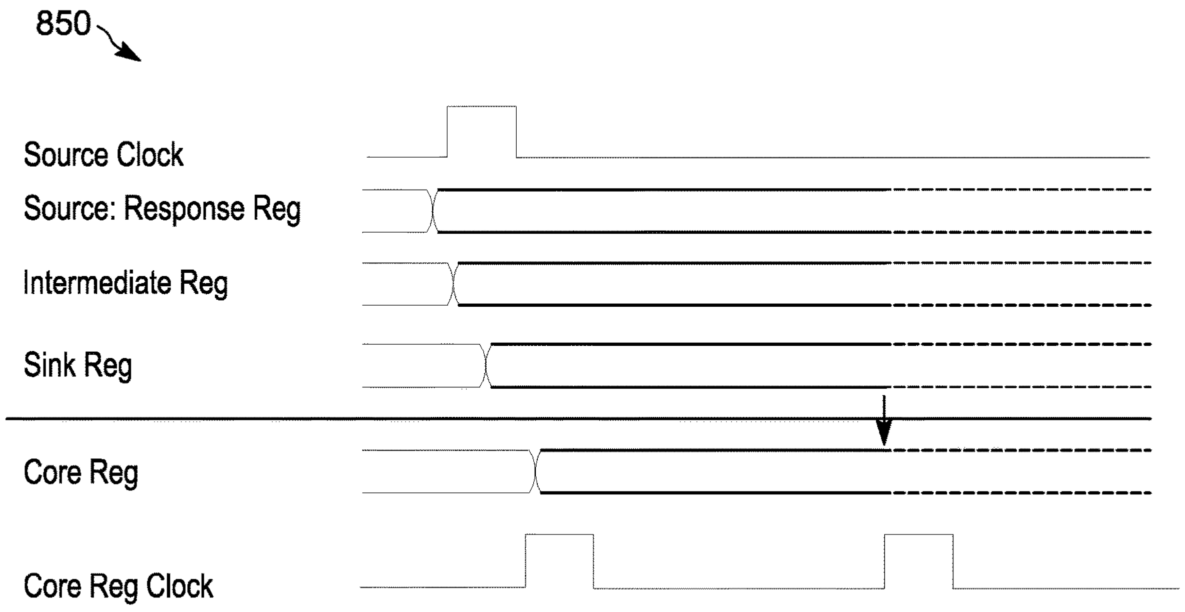
FIG. 8B is a timing diagram illustrating an example of a dataflow that violates the double read policy according to some embodiments.

FIG. 8B is a timing diagram 850 illustrating an example of a dataflow that violates the double read policy according to some embodiments. In this example, the data is moving for a second time to the core (as indicated by the dashed line), even though it is the same I/O response. With the second data move, representing a violation of the double read policy, the core is provided with stale data.

Example Timing Diagram with No Invalid Dataflow Policy Violation

Figure 9A:
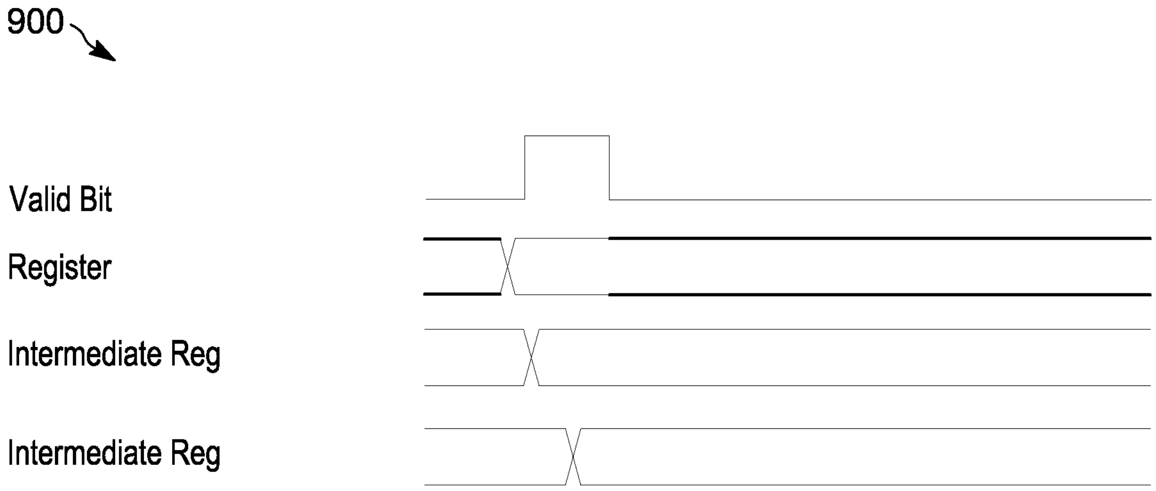
FIG. 9A is a timing diagram illustrating an example of a dataflow that does not violate an invalid dataflow policy according to some embodiments.

FIG. 9A is a timing diagram 900 illustrating an example of a dataflow that does not violate an invalid dataflow policy according to some embodiments. In the examples represented by FIGS. 9A-B, the invalid dataflow policy seeks to avoid conditions in which there is dataflow within the hardware design when there should be no dataflow. Assume for purposes of the present example, the hardware design contains a register (the taint source) and a corresponding valid bit that indicates whether data in the register is valid. The dataflows can be started when the valid bit is low and are expected to remain confined to the taint source. That is, no data should leave the register when the valid bit is low.

In this example, the hardware design behaves as expected. The register is tainted when its corresponding valid bit is low, and no dataflow is observed outside of the register. That is, there is no spread of any of the data from the register through the hardware design.

Example Timing Diagram with an Invalid Dataflow Policy Violation

Figure 9B:
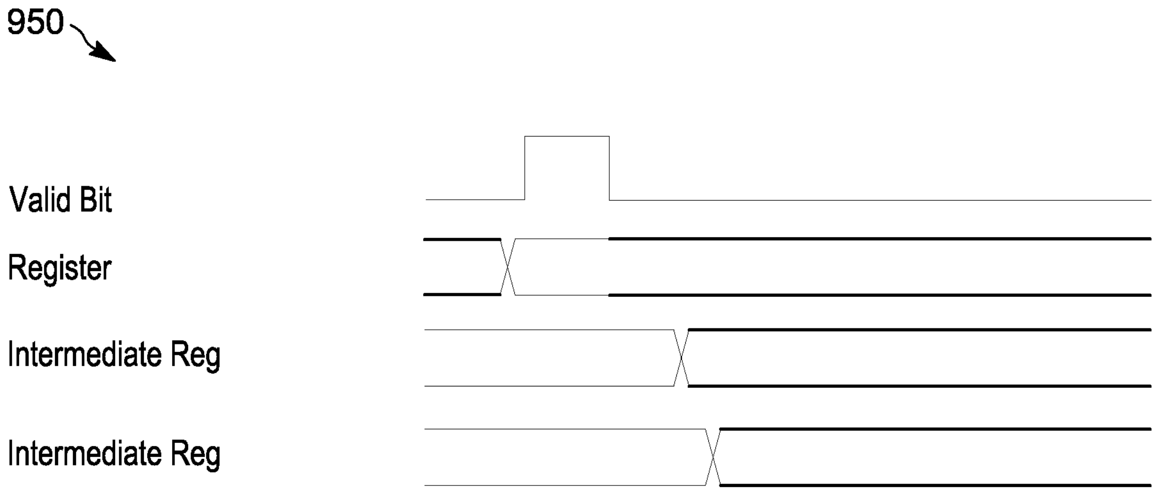
FIG. 9B is a timing diagram illustrating an example of a dataflow that violates the invalid dataflow policy according to some embodiments.

FIG. 9B is a timing diagram 950 illustrating an example of a dataflow that violates the invalid dataflow policy according to some embodiments. In this example, there is a dataflow through the hardware design (represented by the black line in the intermediate registers), showing that the data leaves the register when its valid bit is low. This may be indicative of the presence of a security bug.

Alternative Embodiments

Alternative methods include keying on data, performing more than one injection simulation for a given dataflow specification, and using two injection simulations in place of a baseline simulation and an injection simulation.

In the injection simulations described above, the bitwise inverse of the data present in the taint source at issue is injected each time, so as to allow tracking of the journey of each bit individually if necessary (i.e., a subset of the data being copied from the taint source will also show visible dataflow). While this means the performance of N simulations for N dataflows, it has the benefit of guaranteeing no false positives and perfect dataflow separation.

With respect to keying on data, if the user is willing to take a risk of false positives, or imperfect dataflow separation, or knows that such a risk is not present in the hardware design at issue, the user may opt to inject specific data into the taint source signals, and use the specific data to distinguish among dataflows whenever differences are observed between the baseline and injection simulations. For example, there may be a desire to use one baseline simulation to follow two dataflows. Instead of injecting the bitwise inverses and running an injection simulation for each dataflow as described above, predetermined patterns of data may be injected for each taint source as part of a single injection simulation. For example, the 3 bytes '0x10 0x10 0x10' may be injected in one taint source and '0x20 0x20 0x20' may be injected in the other taint source in which the two injections are combined into one simulation. Then, whenever any simulation trace differences are observed between the baseline simulation and the injection simulation, the dataflows may be distinguished by looking at the data values, and whenever a '0x10' byte is observed it is assumed to be associated with the first dataflow, and whenever a '0x20' by is observed it is assumed to be associated with the second dataflow. In some hardware designs this may be a safe optimization allowing fewer simulations to be performed.

Turning now to the alternative approach involving performing more than one injection simulation for a given dataflow specification, it is to be noted the described method will always be right when it reports dataflow. That is, there are no false positives when making use of the proposed approach; however, there is a chance for under-reporting dataflow. For instance, if a data parity is computed, but the data and its inverse have the same parity, the parity bit will not be reported as flow, even though it is a function of the data. For the intended use this is acceptable, but there may be cases where the operator wishes to see a more complete picture. In such a case, more than one injection simulation may be performed for a given dataflow specification and combined. In the case of parity, a second injection simulation run with a one-bit difference will help. In other cases, the data with all possible 1-bit flips may give more interesting information.

Rather than having one baseline simulation and one injection simulation, another alternative approach would be to utilize two injection simulations, which allow parallel operation. This alternative approach does presuppose knowledge of the moments of injection (for which the baseline simulation is used). If the time is known in advance, this alternative approach has the advantage of running the two injection simulations in parallel; however, the drawback is the need for 2N injection simulations for N dataflows, rather 1+N.

Example Computer System

Figure 10:
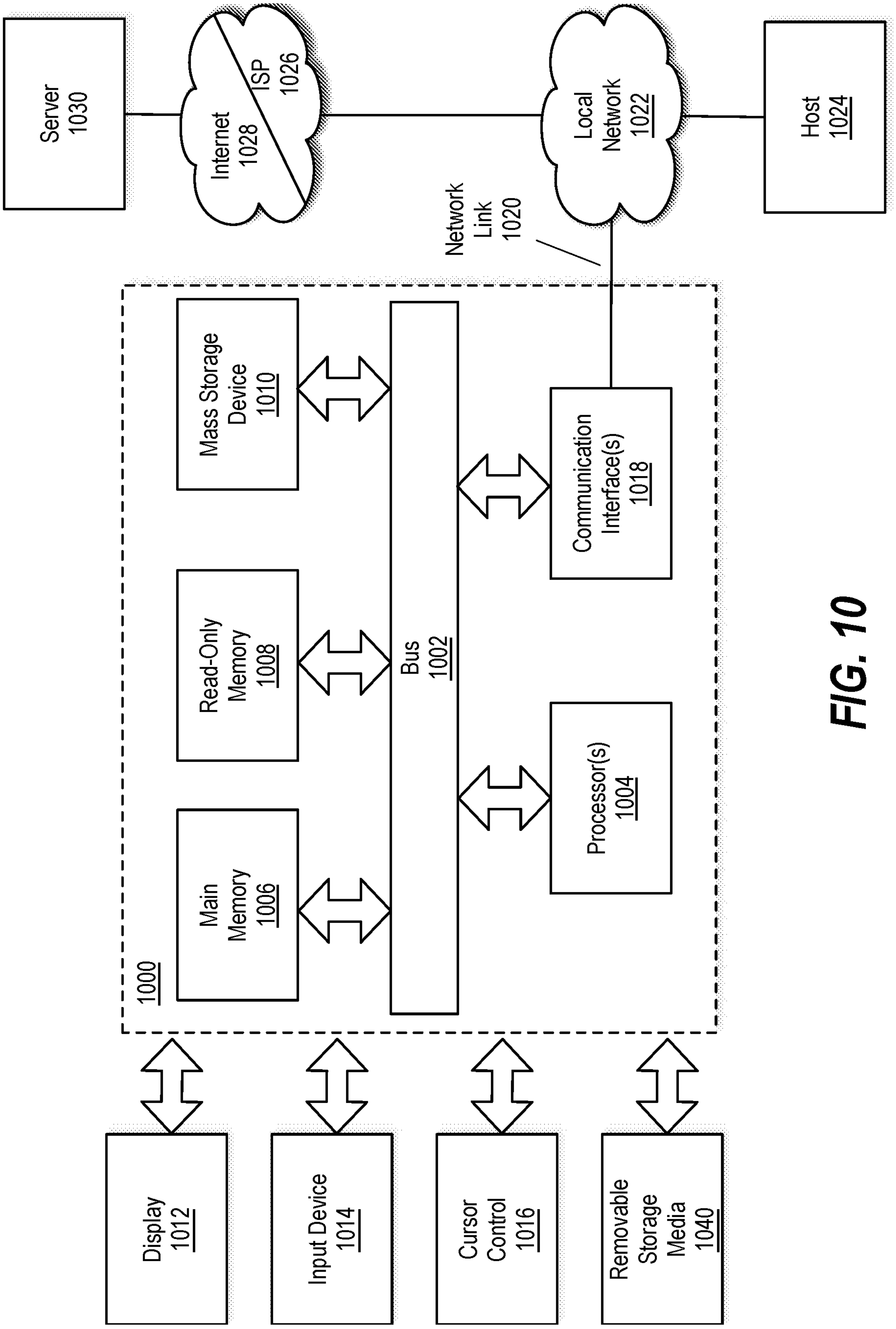
FIG. 10 is an example of a computer system with which some embodiments may be utilized.

FIG. 10 is an example of a computer system 1000 with which some embodiments may be utilized. Notably, components of computer system 1000 described herein are meant only to exemplify various possibilities. In no way should example computer system 1000 limit the scope of the present disclosure. In the context of the present example, computer system 1000 includes a bus 1002 or other communication mechanism for communicating information, and a processing resource (e.g., one or more hardware processors 1004) coupled with bus 1002 for processing information. The processing resource may be, for example, one or more general-purpose microprocessors or a system on a chip (SoC) integrated circuit.

Computer system 1000 also includes a main memory 1006, such as a random-access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Such instructions, when stored in non-transitory storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, e.g., a magnetic disk, optical disk or flash disk (made of flash memory chips), is provided and coupled to bus 1002 for storing information and instructions.

Computer system 1000 may be coupled via bus 1002 to a display 1012, e.g., a cathode ray tube (CRT), Liquid Crystal Display (LCD), Organic Light-Emitting Diode Display (OLED), Digital Light Processing Display (DLP) or the like, for displaying information to a computer user. An input device 1014, including alphanumeric and other keys, is coupled to bus 1002 for communicating information and command selections to processor 1004. Another type of user input device is cursor control 1016, such as a mouse, a trackball, a trackpad, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

Removable storage media 1040 can be any kind of external storage media, including, but not limited to, hard-drives, floppy drives, IOMEGA® Zip Drives, Compact Disc-Read Only Memory (CD-ROM), Compact Disc-Re-Writable (CD-RW), Digital Video Disk-Read Only Memory (DVD-ROM), USB flash drives and the like.

Computer system 1000 may implement the techniques described herein using customized hard-wired logic, one or more ASICs or FPGAs, firmware or program logic which in combination with the computer system causes or programs computer system 1000 to be a special-purpose machine. According to one embodiment, the techniques herein are performed by computer system 1000 in response to processor 1004 executing one or more sequences of one or more instructions contained in main memory 1006. Such instructions may be read into main memory 1006 from another storage medium, such as storage device 1010. Execution of the sequences of instructions contained in main memory 1006 causes processor 1004 to perform the process steps described herein. In alternative embodiments, hard-wired circuitry may be used in place of or in combination with software instructions.

The term "storage media" as used herein refers to any non-transitory media that store data or instructions that cause a machine to operation in a specific fashion. Such storage media may comprise non-volatile media or volatile media. Non-volatile media includes, for example, optical, magnetic or flash disks, such as storage device 1010. Volatile media includes dynamic memory, such as main memory 1006. Common forms of storage media include, for example, a flexible disk, a hard disk, a solid-state drive, a magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 1002. Transmission media can also take the form of acoustic or light waves, such as those generated during radio-wave and infra-red data communications.

Various forms of media may be involved in carrying one or more sequences of one or more instructions to processor 1004 for execution. For example, the instructions may initially be carried on a magnetic disk or solid-state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes interface circuitry 1018 coupled to bus 1002. The interface circuitry 1018 may be implemented by hardware in accordance with any type of interface standard, such as an Ethernet interface, a universal serial bus (USB) interface, a Bluetooth® interface, a near field communication (NFC) interface, a PCI interface, and/or a PCIe interface. As such, interface 1018 may couple the processing resource in communication with one or more discrete accelerators (e.g., one or more XPUs).

Interface 1018 may also provide a two-way data communication coupling to a network link 1020 that is connected to a local network 1022. For example, interface 1018 may be an integrated services digital network (ISDN) card, cable modem, satellite modem, or a modem to provide a data communication connection to a corresponding type of telephone line. As another example, interface 1018 may be a local area network (LAN) card to provide a data communication connection to a compatible LAN. Wireless links may also be implemented. In any such implementation, interface 1018 may send and receive electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the worldwide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018. The received code may be executed by processor 1004 as it is received, or stored in storage device 1010, or other non-volatile storage for later execution.

While many of the methods may be described herein in a basic form, it is to be noted that processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments require more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to perform acts of the method, or of an apparatus or system for facilitating hybrid communication according to embodiments and examples described herein.

Some embodiments pertain to Example 1 that includes a non-transitory machine-readable medium storing instructions, which when executed by a processing resource of a computer system cause the processing resource to: receive a dataflow specification indicative of a dataflow of a taint source within a hardware design to be evaluated; cause a simulator to perform a first simulation and a second simulation of the hardware design and record a first simulation trace log and a second simulation trace log, wherein during the second simulation, the taint source is altered based on the dataflow specification; for each signal of a plurality of signals in the hardware design, generating flow metadata indicative of whether the signal or a portion thereof is part of the dataflow at one or more instances of simulated time based on the first simulation trace log and the second simulation trace log; and detect a potential security issue within the hardware design by applying a policy to the flow metadata.

Example 2 includes the subject matter of Example 1, wherein the dataflow specification includes a start event, defining a start of the dataflow in a form of a moment or a period during the second simulation and wherein the start event is expressed as: a simulation time of the second simulation; a comparison involving a value of a signal of the hardware design; the value being zero or one; a transition of the value from zero to one or from one to zero; or an arbitrary logical condition of one or more of the foregoing.

Example 3 includes the subject matter of Example 1 or 2, wherein the first simulation comprises a baseline simulation during which no alteration of the taint source is performed.

Example 4 includes the subject matter of Example 3, wherein the second simulation comprises an injection simulation and wherein alteration of the taint source during the injection simulation comprises writing a bitwise inverse of a value of the taint source during the baseline simulation to the taint source during the injection simulation or forcing the taint source to the bitwise inverse during the injection simulation.

Example 5 includes the subject matter of any of Examples 1-4, wherein the first simulation comprises a first injection simulation during which a value is written to the taint source or the taint source is forced to the value.

Example 6 includes the subject matter of Example 5, wherein the second simulation comprises a second injection simulation during which a bitwise inverse of the value is written to the taint source or the taint source is forced to the bitwise inverse of the value.

Some embodiments pertain to Example 7 that includes a method for tracking dataflows in a hardware design represented in a hardware description language (HDL) without instrumenting the HDL, the method comprising: receiving a plurality of a dataflow primitives specifying of a plurality of taint sources from which dataflows are to be tracked within the hardware design; obtaining a baseline simulation trace log for a baseline register transfer level (RTL) simulation of the hardware design by causing a simulator to perform the baseline RTL simulation during which none of the plurality of taint sources are altered; obtaining a plurality of injection simulation trace logs for a plurality of injection RTL simulations of the hardware design by causing the simulator to perform, for each taint source of the plurality of taint sources, an injection RTL simulation during which the taint source is altered; for each signal of a plurality of signals in the hardware design, generating flow metadata indicative of whether the signal or a portion thereof is part of any of the dataflows at one or more instances of simulated time based on the plurality of injection simulation trace logs; and detecting a potential security issue within the hardware design by applying a policy to the flow metadata.

Example 8 includes the subject matter of Examples 7, wherein the potential security issue comprises mixed dataflows and wherein the policy specifies a condition in which a plurality of the dataflows are present in a given register of the hardware design at a same simulation time.

Example 9 includes the subject matter of Example 7, wherein the potential security issue comprises a stale data error and wherein the policy specifies a condition in which a dataflow of the dataflows is copied more than once to any adversarially observable register of the hardware design.

Example 10 includes the subject matter of Example 7, wherein the potential security issue comprises a stale data error and wherein the policy specifies a condition in which data associated with a particular dataflow of the dataflows propagates through the hardware design when the data should not be propagating.

Some embodiments pertain to Example 11 that includes a system comprising: a processing resource; and instructions, which when executed by the processing resource cause the processing resource to: receive a dataflow specification indicative of a dataflow of a taint source within a hardware design to be evaluated; obtain a first simulation trace log for a first register transfer level (RTL) simulation of the hardware design by causing a simulator to perform the first RTL simulation; obtain a second simulation trace log for a second RTL simulation of the hardware design by causing the simulator to perform the second RTL simulation during which the taint source is altered based on the dataflow specification; for each signal of a plurality of signals in the hardware design, generating flow metadata indicative of whether the signal or a portion thereof is part of the dataflow at one or more instances of simulated time based on the first simulation trace log and the second simulation trace log; and detect a potential security issue within the hardware design by applying a policy to the flow metadata.

Example 12 includes the subject matter of Example 11, wherein the dataflow specification includes a start event, defining a start of the dataflow in a form of a moment or a period during the second RTL simulation and wherein the start event is expressed as: a simulation time of the second RTL simulation; a comparison involving a value of a signal of the hardware design; the value being zero or one; a transition of the value from zero to one or from one to zero; or an arbitrary logical condition of one or more of the foregoing.

Example 13 includes the subject matter of Examples 11 or 12, wherein the first RTL simulation comprises a baseline simulation during which no alteration of the taint source is performed.

Example 14 includes the subject matter of Example 13, wherein the second RTL simulation comprises an injection simulation and wherein alteration of the taint source during the injection simulation comprises writing a bitwise inverse of a value of the taint source during the baseline simulation to the taint source during the injection simulation or forcing the taint source to the bitwise inverse during the injection simulation.

Example 15 includes the subject matter of any of Examples 11-14, wherein the first RTL simulation comprises a first injection simulation during which zero is written to the taint source or the taint source is forced to zero.

Example 16 includes the subject matter of Example 15, wherein the second RTL simulation comprises a second injection simulation during which a bitwise inverse of zero is written to the taint source or the taint source is forced to the bitwise inverse of zero.

Example 17 includes the subject matter of any of Examples 11-16, wherein the potential security issue comprises mixed dataflows and wherein the policy specifies a condition in which the dataflow is present in a given register of the hardware design at a same simulation time as another dataflow.

Example 18 includes the subject matter of any of Examples 11-16, wherein the potential security issue comprises a stale data error.

Example 19 includes the subject matter of Example 18, wherein the policy specifies a condition in which the dataflow is copied more than once to a user-facing bus of the hardware design.

Example 20 includes the subject matter of Example 18, wherein the policy specifies a condition in which data associated with the dataflow propagates through the hardware design when the data should not be propagating.

Some embodiments pertain to Example 21 that includes an apparatus that implements or performs a method of any of Examples 7-10.

Example 22 includes at least one machine-readable medium comprising a plurality of instructions, when executed on a computing device, implement or perform a method or realize an apparatus as described in any preceding Example.

Example 23 includes an apparatus comprising means for performing a method as claimed in any of Examples 7-10.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A non-transitory machine-readable medium storing instructions, which when executed by a processing resource of a computer system cause the processing resource to:

receive a dataflow specification indicative of a dataflow of a taint source within a hardware design to be evaluated;

cause a simulator to perform a first simulation and a second simulation of the hardware design and record a first simulation trace log and a second simulation trace log, wherein during the second simulation, the taint source is altered based on the dataflow specification;

for each signal of a plurality of signals in the hardware design, generating flow metadata indicative of whether the signal or a portion thereof is part of the dataflow at one or more instances of simulated time based on the first simulation trace log and the second simulation trace log; and detect a potential security issue within the hardware design by applying a policy to the flow metadata.

2. The non-transitory machine-readable medium of claim 1, wherein the dataflow specification includes a start event, defining a start of the dataflow in a form of a moment or a period during the second simulation and wherein the start event is expressed as:

a simulation time of the second simulation;

a comparison involving a value of a signal of the hardware design;

the value being zero or one;

a transition of the value from zero to one or from one to zero; or an arbitrary logical condition of one or more of the foregoing.

3. The non-transitory machine-readable medium of claim 1, wherein the first simulation comprises a baseline simulation and wherein, during the first simulation, no alteration of the taint source is performed.

4. The non-transitory machine-readable medium of claim 3, wherein the second simulation comprises an injection simulation and wherein alteration of the taint source during the injection simulation comprises writing a bitwise inverse of a value of the taint source during the baseline simulation to the taint source during the injection simulation or forcing the taint source to the bitwise inverse during the injection simulation.

5. The non-transitory machine-readable medium of claim 1, wherein the first simulation comprises a first injection simulation and wherein, during the first injection simulation, a value is written to the taint source or the taint source is forced to the value.

6. The non-transitory machine-readable medium of claim 5, wherein the second simulation comprises a second injection simulation and wherein, during the second injection simulation, a bitwise inverse of the value is written to the taint source or the taint source is forced to the bitwise inverse of the value.

7. A method for tracking dataflows in a hardware design represented in a hardware description language (HDL) without instrumenting the HDL, the method comprising:

receiving a plurality of a dataflow primitives specifying of a plurality of taint sources from which dataflows are to be tracked within the hardware design;

obtaining a baseline simulation trace log for a baseline register transfer level (RTL) simulation of the hardware design by causing a simulator to perform the baseline RTL simulation, wherein, during the baseline RTL simulation, none of the plurality of taint sources are altered;

obtaining a plurality of injection simulation trace logs for a plurality of injection RTL simulations of the hardware design by causing the simulator to perform, for each taint source of the plurality of taint sources, an injection RTL simulation, wherein, during the injection RTL simulation, the taint source is altered;

for each signal of a plurality of signals in the hardware design, generating flow metadata indicative of whether the signal or a portion thereof is part of any of the dataflows at one or more instances of simulated time based on the plurality of injection simulation trace logs; and detecting a potential security issue within the hardware design by applying a policy to the flow metadata.

8. The method of claim 7, wherein the potential security issue comprises mixed dataflows and wherein the policy specifies a condition in which a plurality of the dataflows are present in a given register of the hardware design at a same simulation time.

9. The method of claim 7, wherein the potential security issue comprises a stale data error and wherein the policy specifies a condition in which a dataflow of the dataflows is copied more than once to any adversarially observable register of the hardware design.

10. The method of claim 7, wherein the potential security issue comprises a stale data error and wherein the policy specifies a condition in which data associated with a particular dataflow of the dataflows propagates through the hardware design when the data should not be propagating.

11. A system comprising:

a processing resource; and instructions, which when executed by the processing resource cause the processing resource to:

receive a dataflow specification indicative of a dataflow of a taint source within a hardware design to be evaluated;

obtain a first simulation trace log for a first register transfer level (RTL) simulation of the hardware design by causing a simulator to perform the first RTL simulation;

obtain a second simulation trace log for a second RTL simulation of the hardware design by causing the simulator to perform the second RTL simulation, wherein, during the second RTL simulation, the taint source is altered based on the dataflow specification;

for each signal of a plurality of signals in the hardware design, generating flow metadata indicative of whether the signal or a portion thereof is part of the dataflow at one or more instances of simulated time based on the first simulation trace log and the second simulation trace log; and detect a potential security issue within the hardware design by applying a policy to the flow metadata.

12. The system of claim 11, wherein the dataflow specification includes a start event, defining a start of the dataflow in a form of a moment or a period during the second RTL simulation and wherein the start event is expressed as:

a simulation time of the second RTL simulation;

a comparison involving a value of a signal of the hardware design;

the value being zero or one;

a transition of the value from zero to one or from one to zero; or an arbitrary logical condition of one or more of the foregoing.

13. The system of claim 11, wherein the first RTL simulation comprises a baseline simulation and wherein, during the baseline simulation, no alteration of the taint source is performed.

14. The system of claim 13, wherein the second RTL simulation comprises an injection simulation and wherein alteration of the taint source during the injection simulation comprises writing a bitwise inverse of a value of the taint source during the baseline simulation to the taint source during the injection simulation or forcing the taint source to the bitwise inverse during the injection simulation.

15. The system of claim 11, wherein the first RTL simulation comprises a first injection simulation and wherein, during the first injection simulation, zero is written to the taint source or the taint source is forced to zero.

16. The system of claim 15, wherein the second RTL simulation comprises a second injection simulation and wherein, during the second injection simulation, a bitwise inverse of zero is written to the taint source or the taint source is forced to the bitwise inverse of zero.

17. The system of claim 11, wherein the potential security issue comprises mixed dataflows and wherein the policy specifies a condition in which the dataflow is present in a given register of the hardware design at a same simulation time as another dataflow.

18. The system of claim 11, wherein the potential security issue comprises a stale data error.

19. The system of claim 18, wherein the policy specifies a condition in which the dataflow is copied more than once to a user-facing bus of the hardware design.

20. The system of claim 18, wherein the policy specifies a condition in which data associated with the dataflow propagates through the hardware design when the data should not be propagating.

* * * * *